(12) United States Patent
Tanaka et al.

(10) Patent No.: US 8,987,903 B2
(45) Date of Patent: Mar. 24, 2015

(54) SEMICONDUCTOR DEVICE AND SEMICONDUCTOR DEVICE MANUFACTURING METHOD

(71) Applicant: Sony Corporation, Tokyo (JP)

(72) Inventors: Takayuki Tanaka, Oita (JP); Kana Iwami, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/018,109

(22) Filed: Sep. 4, 2013

(65) Prior Publication Data

US 2014/0151873 A1    Jun. 5, 2014

(30) Foreign Application Priority Data

Sep. 21, 2012 (JP) ................. 2012-208303

(51) Int. Cl.
*H01L 23/00* (2006.01)
*H01L 21/00* (2006.01)

(52) U.S. Cl.
CPC ............... *H01L 24/09* (2013.01); *H01L 24/81* (2013.01); *H01L 2924/00* (2013.01); *H01L 2224/16225* (2013.01); *H01L 2224/32225* (2013.01); *H01L 2224/73204* (2013.01); *H01L 2224/83193* (2013.01); *H01L 2224/92125* (2013.01)
USPC .......................................... 257/737; 439/108

(58) Field of Classification Search
CPC ......... H01L 24/09; H01L 24/81; H01L 24/12; H01L 24/11; H01L 2224/16225; H01L 2224/32225; H01L 2224/73204; H01L 2224/83193; H01L 2224/92125; H01L 2924/00
USPC .......... 257/737, 777, 779, 782, 784; 438/108, 438/107, 112
See application file for complete search history.

(56) References Cited

U.S. PATENT DOCUMENTS 5,426,266 A * 6/1995 Brown et al. ................. 174/267
6,677,674 B2 * 1/2004 Nagao ........................... 257/724

FOREIGN PATENT DOCUMENTS

JP       2010-192886       9/2010

\* cited by examiner

*Primary Examiner* — Nikolay Yushin
(74) *Attorney, Agent, or Firm* — Dentons US LLP

(57) ABSTRACT

A semiconductor device including a first semiconductor chip and a second semiconductor chip which are bump bonded to each other with a clearance therebetween sealed with resin injected from a prescribed position on the first semiconductor chip in a manner that a space between bumps formed by bump bonding is filled with the resin, and a plurality of concave and convex sections which are formed on a surface side of the first semiconductor chip, the surface being bonded with the second semiconductor chip, and have a protruding section which straddles at least one convex section out of convex sections of the plurality of concave and convex sections formed in a surrounding section of a bonding region between the first semiconductor chip and the second semiconductor chip.

12 Claims, 15 Drawing Sheets

1 ··· LOWER CHIP
1a ··· DAM
1b ··· WIRING
1c ··· PROTRUDING SECTION
2 ··· UPPER CHIP
3 ··· BUMP
10 ··· SEMICONDUCTOR DEVICE

1 ··· LOWER CHIP
1a ··· DAM
1b ··· WIRING
1c ··· PROTRUDING SECTION
2 ··· UPPER CHIP
10 ··· SEMICONDUCTOR DEVICE

1 · · · LOWER CHIP
1a · · · DAM
1b · · · WIRING
2 · · · UPPER CHIP

1b ··· WIRING
2 ··· UPPER CHIP
105 ··· FILLET

1 · · · LOWER CHIP
1a · · · DAM
1b · · · WIRING
1c · · · PROTRUDING SECTION
2 · · · UPPER CHIP
10 · · · SEMICONDUCTOR DEVICE

1a ・・・ DAM
1b ・・・ WIRING
2 ・・・ UPPER CHIP
104 ・・・ RESIN

1 · · · LOWER CHIP
1a · · · DAM
1b · · · WIRING
1c · · · PROTRUDING SECTION
2 · · · UPPER CHIP
10 · · · SEMICONDUCTOR DEVICE

1 · · · LOWER CHIP
1a · · · DAM
1b · · · WIRING
1c · · · PROTRUDING SECTION
2 · · · UPPER CHIP
3 · · · BUMP
10 · · · SEMICONDUCTOR DEVICE

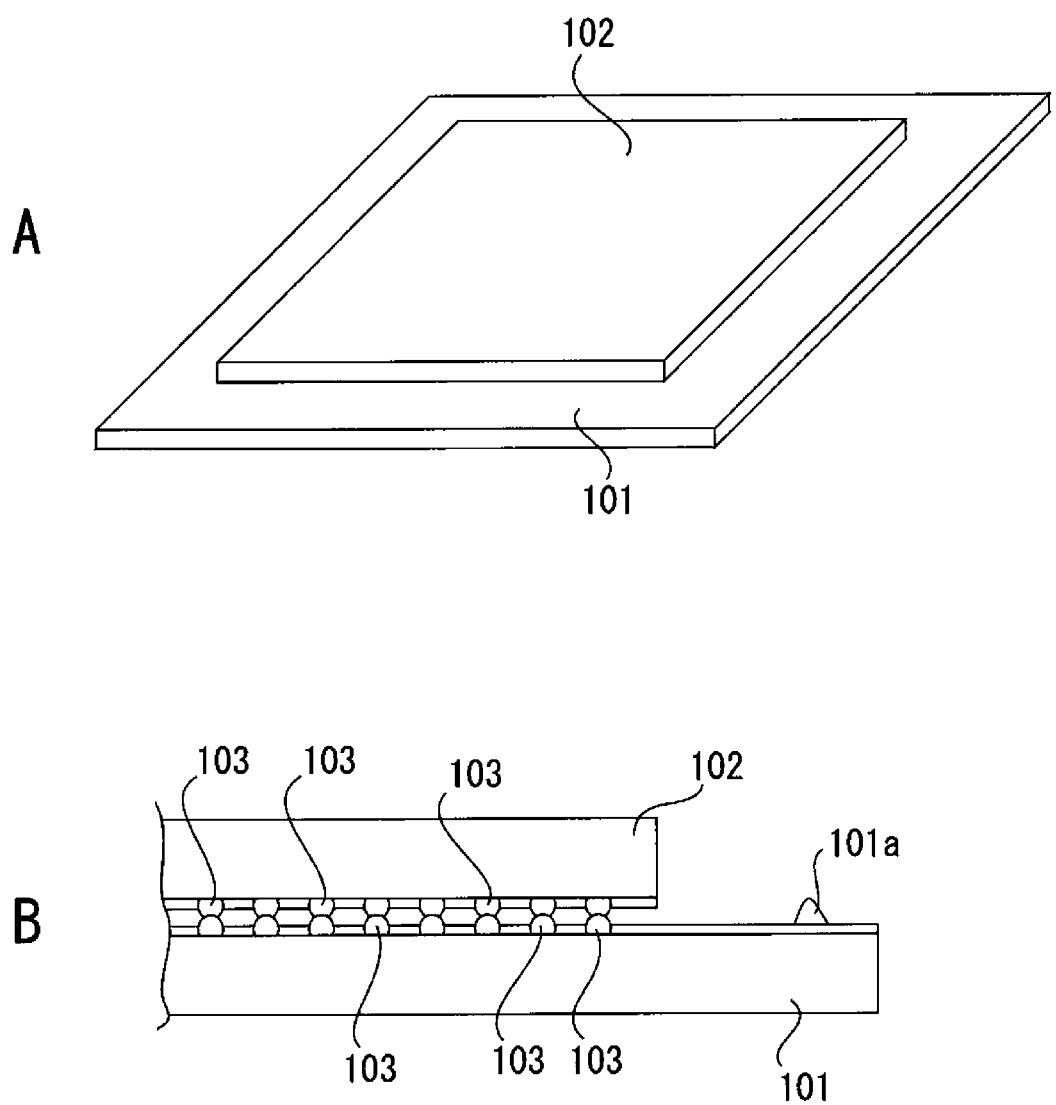
FIG. 10 - RELATED ART

FIG. 11 - RELATED ART
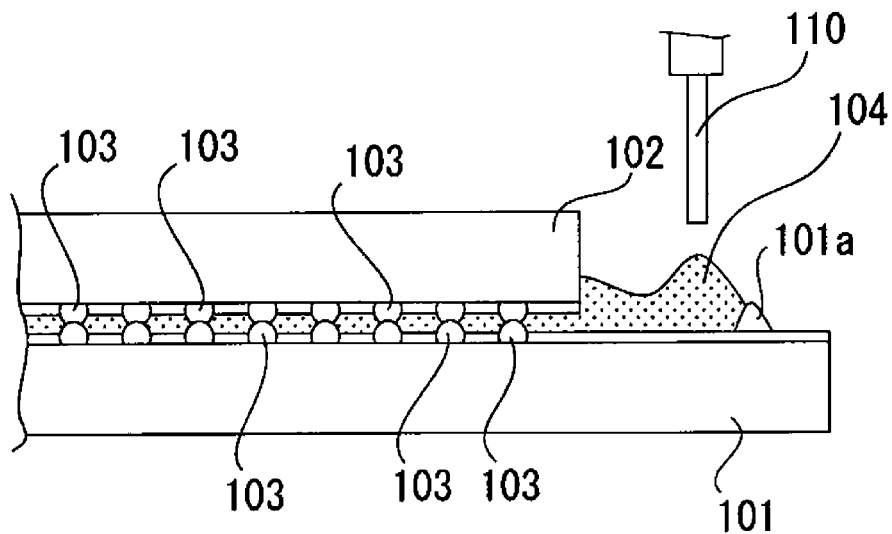

FIG. 12 - RELATED ART
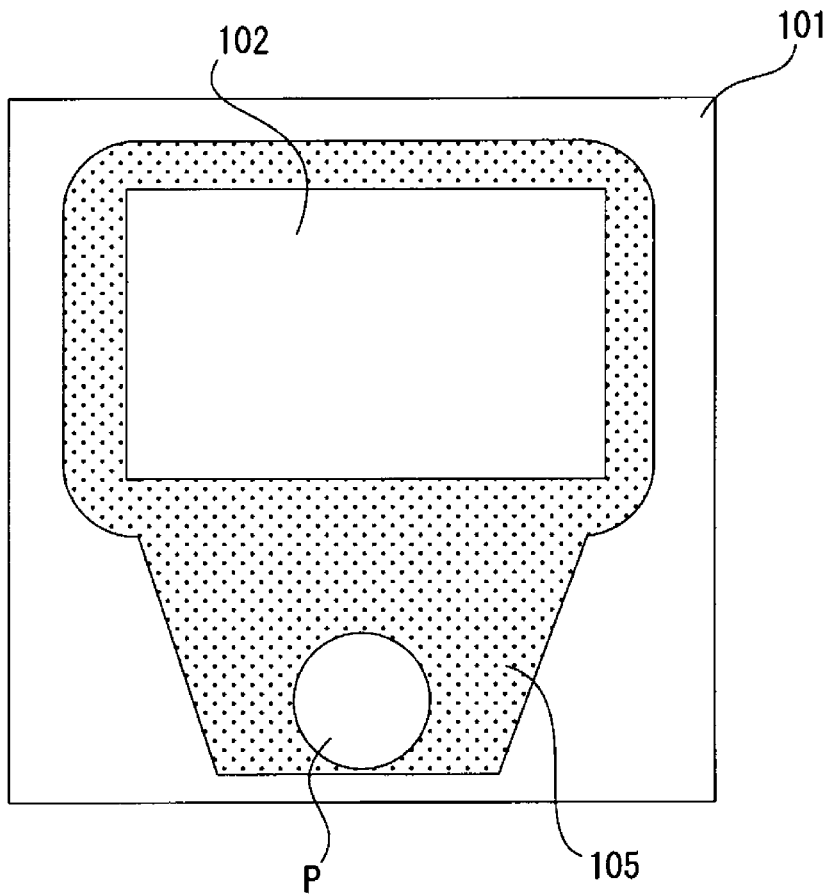
105 · · · FILLET

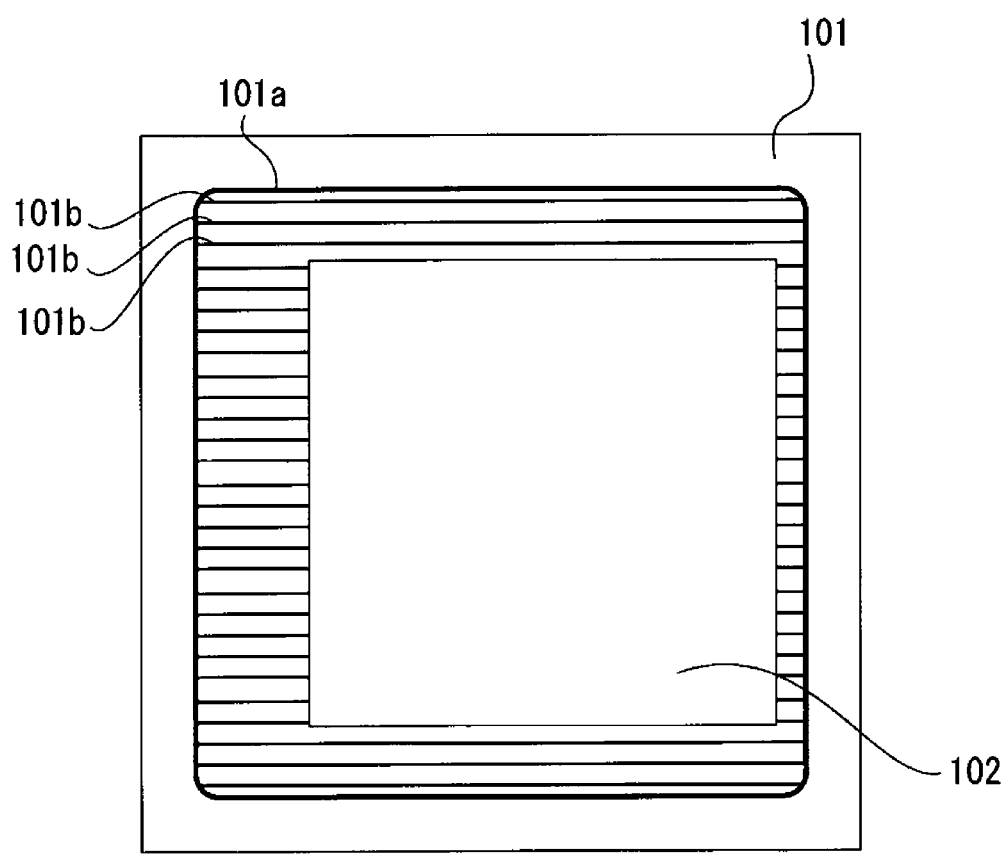
FIG. 13 - RELATED ART

FIG. 14 - RELATED ART
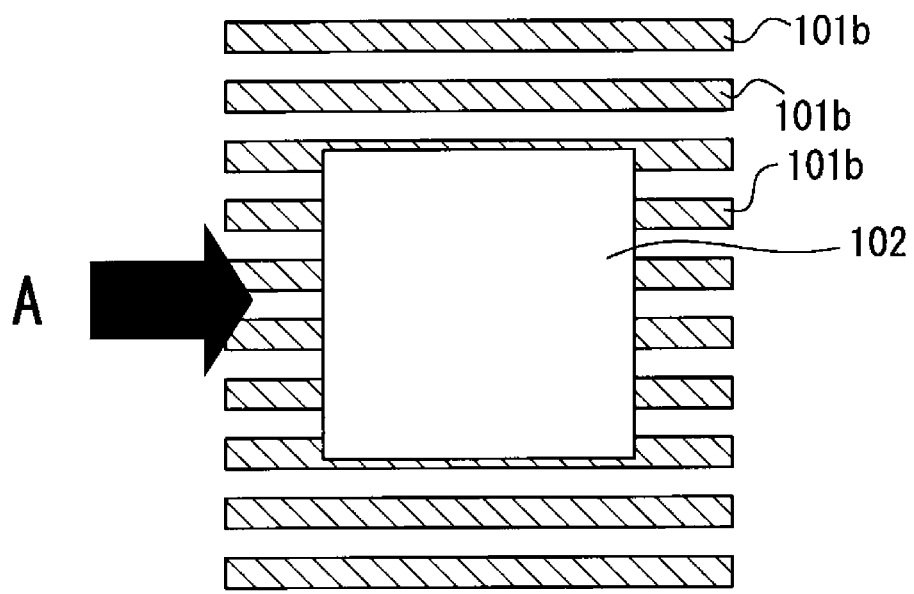
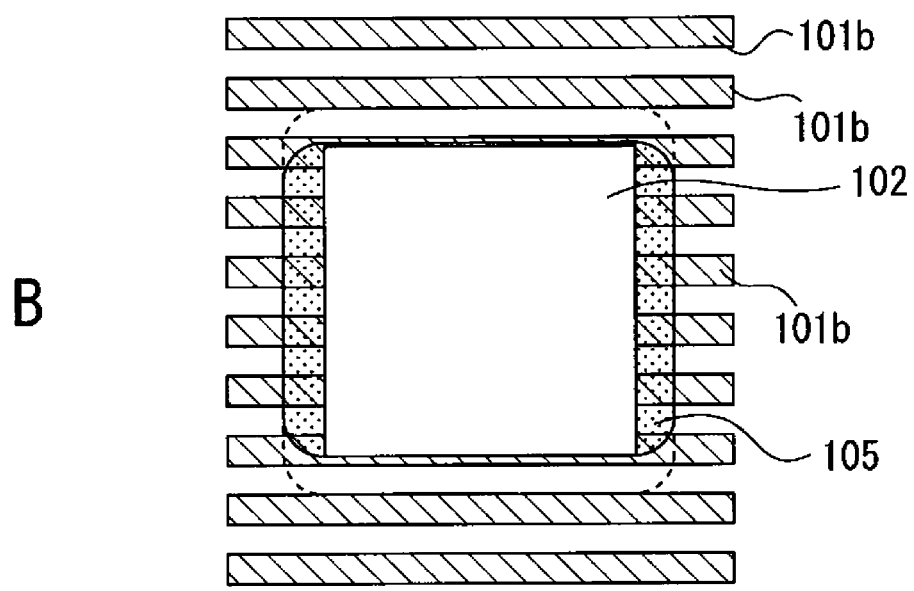
105 · · · FILLET

FIG. 15 - RELATED ART
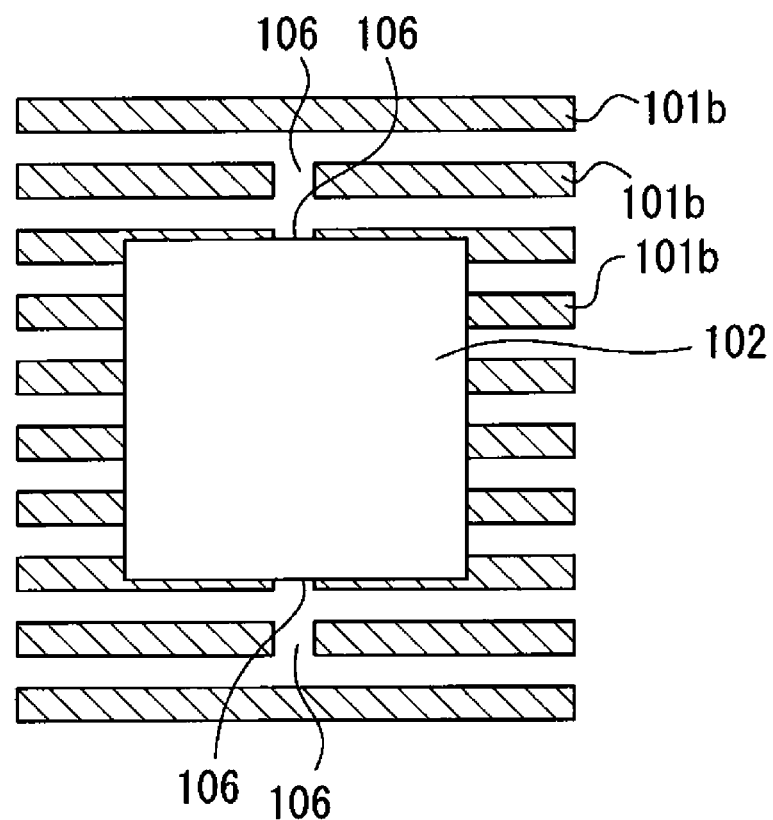
A
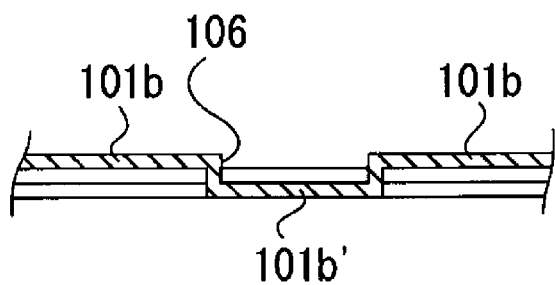
B

SEMICONDUCTOR DEVICE AND SEMICONDUCTOR DEVICE MANUFACTURING METHOD

BACKGROUND

The present disclosure relates to the technical field of a semiconductor device, and a manufacturing method of a semiconductor device. In detail, the present disclosure relates to the technical field of a semiconductor device having a so-called flip-chip structure, in which a second semiconductor chip is bump bonded on a first semiconductor chip, and a manufacturing method of this semiconductor device, which forms a fillet with a suitable width while preventing a reduction in the degree of freedom in design.

A semiconductor device with a flip chip structure (chip-on-chip type) is known which bump bonds another semiconductor chip on a semiconductor chip.

FIGS. 10A and 10B schematically show a structure of a semiconductor device with a flip-chip structure.

As shown in the perspective view of FIG. 10A and the cross-section view of FIG. 10B, a semiconductor device with a flip-chip structure has an upper chip 102 bonded on a lower chip 101, via a plurality of bumps 103.

The upper chip 102, as a memory chip (for example, a DRAM (Dynamic Random Access Memory) or the like), bump bonded on the lower chip 101, as a logic circuit chip, can be included as an example of such a semiconductor device with a flip-chip structure.

In a semiconductor device with a flip-chip structure, filling of a liquid resin, called an under-fill material (a UF material) for the purpose of protecting the bumps 103, is performed between the chips bonded via the bumps 103, and sealing is performed for the clearance between the lower chip 101 and the upper chip 102.

FIG. 11 shows a state in which resin 104 is filled as an under-fill material.

As shown in FIG. 11, the resin 104 is injected at a prescribed position of the lower chip 101, by a nozzle 110. This injected resin 104 leaks out and spreads on the lower chip 101, and reaches within the bonding region with the upper chip 102. The resin 104 penetrates the spaces between the bumps 103 (spaces between bumps) by a capillary phenomenon, and the clearance between the lower chip 101 and the upper chip 102 is sealed.

In this case, in order to prevent leakage of the resin 104 to the outside of the lower chip 101, a dam 101a with a prescribed height is included at an outer peripheral section of the lower chip 101 (refer to FIG. 10B and FIG. 11).

The resin 104 which seals the clearance between the lower chip 101 and the upper chip 102 as described above is cured, for example, by heat treatment or the like. In this way, cracking of the bumps 103 due to stress concentrations is prevented, and the connection reliability between the lower chip 101 and the upper chip 102 (also including the electrical connection via the bumps 103) can be improved, by relaxing the influence of external stresses such as moisture absorption.

Here, after the resin 104 is injected as a UF material such as described above, the resin 104, which has advanced into the spaces between the bumps by a capillary phenomenon, will also leak out to the outside of the bonding region of the lower chip 101 and the upper chip 102. In this way, a fillet 105 is formed, such as shown in the following FIG. 12.

In FIG. 12, a state of a semiconductor device after the injection of resin 104 is shown by an upper view, and a circle P within the figure represents the injection point of the resin 104. In accordance with the injection of the resin 104 by the tip of the nozzle 110, the resin 104 advances from the injection position P in the direction of the bonding region with the upper chip 102. Then, after the spaces between the bumps within the bonding region are filled such as described previously, the resin will leak out to the outside of the bonding region.

The fillet 105 indicates the resin portion formed outside of the bonding region with the upper chip 102.

Here, in a semiconductor device with a flip-chip structure, such as shown in the upper view of FIG. 13, a plurality of lines of wiring 101b is formed on the surface side of the lower chip 101, that is, on the bonding surface side with the upper chip 102.

In accordance with the formation of these lines of wiring 101b, concave and convex sections are formed on the surface of the lower chip 101, by the formed portions/un-formed portions of the wiring 101b.

In the case where such concave and convex sections are formed on the surface of the lower chip 101 in accordance with the formation of the wiring 101b, it becomes difficult to form the fillet 105 with a prescribed width.

The reason for this will be described by with reference to FIGS. 14A and 14B. In FIGS. 14A and 14B, a case is illustrated where the advancing direction of the resin 104 and the wiring direction are parallel to each other. That is, in this case, the resin 104 is injected from the injection position shown by the thick arrow in FIG. 14A, and in this way, the resin 104 advances from the injection position in the direction in which the upper chip 102 is formed, and the advancing direction of the resin 104 becomes a direction parallel to the wiring direction of the wiring 101b.

In this case, when the resin 104 is injected such as in FIG. 14A, a width of the fillet 105 is not able be formed with a prescribed width, such as shown in FIG. 14B (a width shown by the dotted line within the figure).

In the case where there are concave and convex sections on the lower chip 101 in accordance with the wiring 101b, the resin 104 injected to the lower chip 101 penetrates within the bonding region with the upper chip 102 by a capillary phenomenon, and thereafter remains in these convex sections, due to surface tension finally acting on the convex sections as formed portions of the wiring 101b. In other words, it may not be possible to go ahead of any of the lines of wiring 101b. Accordingly, the spreading of the fillet 105 will be stopped by the formed portions of the wiring 101b, and the formation of the fillet 105 with a prescribed width becomes difficult.

Note that, when stating for confirmation, if the injected resin 104 reaches within the bonding region with the upper chip 102, it will advance within the bonding region by a capillary phenomenon due to the spaces between the bumps within the bonding region. However, outside of the bonding region, a capillary phenomenon does not occur, the advancement of the resin is stopped by the formed portions of the wiring 101b at the side surface section of the bonding region, and the width of the fillet 105 will be restricted by the formed positions of the wiring 101b.

On the other hand, in the back side of this bonding region (the back side when viewed from the injection position), since the convex sections, which obstruct the advancement of the resin 104 by a capillary phenomenon (the convex sections orthogonal to the resin advancing direction), do not exist in the bonding region, the spreading of the fillet 105 will not be restricted.

As a result of this, as the fillet 105 of this case, the spreading of this side surface section, when viewed from the injection position of the resin 104, will be restricted, such as shown in FIG. 14B.

It is desirable that the width of the fillet 105 is formed with a prescribed width, in terms of the reliability, quality and the like of bonding. Therefore, it may be necessary to avoid situations such as when the fillet width is restricted, such as described above.

Here, for example, such as described in JP 2010-192886A, the inventors have proposed technology, related to a semiconductor device with a flip-chip structure in which concave and convex sections are provided on the surface of the lower chip 101 in accordance with the formation of the wiring 101b, which forms slits for the wiring 101b.

FIGS. 15A and 15B are explanatory diagrams for a semiconductor device in which slits are formed. FIG. 15A is an upper view of the semiconductor device, and FIG. 15B is a cross-section view of the semiconductor device (only the formed portions of the slits are extracted).

As shown in FIG. 15A and FIG. 15B, in a semiconductor device of this case, slits 106 are formed, as concave sections, on the wiring 101b formed in a surrounding section of the bonding region with the upper chip 102.

By forming such slits 106 on the surrounding section of the bonding region with the upper chip 102, the resin 104, which has advanced within the bonding region by a capillary phenomenon, can be poured into an outer side, via the slits 106. That is, the width of the fillet 105 can be prevented from being restricted by the formed portions of the wiring 101b.

By an adjustment of the length of these slits 106, it becomes possible for an adjustment of the width of the fillet 105, and it becomes possible for a formation of the fillet 105 with a prescribed width.

SUMMARY

However, in the case where the slits 106 are formed such as described above, the wiring 101b may be made to bypass to a lower layer, such as shown in FIG. 15B, in response to the formed portions of the slits 106. Within FIG. 15B, the bypass portion of the wiring 101b is represented as the wiring 101b'.

When such wiring 101b is made to bypass to a lower layer, the electrical resistance will increase in the portion which connects the wiring 101b' of the lower side and the wiring 101b of the upper side. That is, as a result, there are cases where securing normal performance will become difficult.

While creating new wiring rules can be considered in order to avoid this, the creation of new wiring rules leads to restrictions of the design, and as a result, may obstruct the degree of freedom in design.

The present disclosure is performed by considering such a problem, and forming a fillet with a suitable width while preventing a reduction in the degree of freedom in design is a problem for a semiconductor device with a flip-chip structure, in which a plurality of concave and convex sections are provided, for example, on the chip surface of the lower side in accordance with the formation of wiring.

Firstly, according to an embodiment of the present disclosure, there is provided a semiconductor device including a first semiconductor chip and a second semiconductor chip which are bump bonded to each other with a clearance therebetween sealed with resin injected from a prescribed position on the first semiconductor chip in a manner that a space between bumps formed by bump bonding is filled with the resin, and a plurality of concave and convex sections which are formed on a surface side of the first semiconductor chip, the surface being bonded with the second semiconductor chip, and have a protruding section which straddles at least one convex section out of convex sections of the plurality of concave and convex sections formed in a surrounding section of a bonding region between the first semiconductor chip and the second semiconductor chip.

Therefore, in the semiconductor device, the resin, which has surged up to the convex sections where the protruding section is included, flows into the concave sections between adjacent convex sections along the surface of the protruding section.

Secondly, in the semiconductor device, it is preferable that a longitudinal direction of the plurality of concave and convex sections is a direction parallel to an advancing direction on the first semiconductor chip of the resin injected from the prescribed position, and that the protruding section, when viewed from the injection position of the resin, is formed on a region of both side surface sides of the bonding region with the second semiconductor chip on the first semiconductor chip.

The longitudinal direction of the plurality of concave and convex sections is a direction parallel to an advancing direction of the resin, and the situation in which the spreading of the resin is restricted is effectively avoided, by having the protruding section, when viewed from the injection position of the resin, formed on a region of both side surface sides of the bonding region with the second semiconductor chip on the first semiconductor chip.

Thirdly, in the semiconductor device, it is preferable that a longitudinal direction of the plurality of concave and convex sections is a direction intersecting an advancing direction on the first semiconductor chip of the resin injected from the prescribed position, and that the protruding section, when viewed from the injection position of the resin, is formed on a region of a back side of the bonding region with the second semiconductor chip on the first semiconductor chip The longitudinal direction of the plurality of concave and convex sections is a direction intersecting an advancing direction of the resin, and it becomes possible to pour the resin into a region which is the back side of the bonding region with the second semiconductor chip via the protruding section, by having the protruding section, when viewed from the injection position of the resin, formed on the region of the back side of the bonding region with the second semiconductor chip on the first semiconductor chip.

Fourthly, in the semiconductor device, it is preferable that a longitudinal direction of the plurality of concave and convex sections is a direction intersecting an advancing direction on the first semiconductor chip of the resin injected from the prescribed position, and that the protruding section, when viewed from the injection position of the resin, is formed on a region of a front side of the bonding region with the second semiconductor chip on the first semiconductor chip.

The longitudinal direction of the plurality of concave and convex sections is a direction intersecting the advancing direction of the resin, and it becomes possible to guide the resin within the bonding region via the protruding section, by having the protruding section, when viewed from the injection position of the resin, formed on a region of the front side of the bonding region with the second semiconductor chip on the first semiconductor chip.

Fifthly, in the semiconductor device, the plurality of concave and convex sections is provided in accordance with the formation of the wiring. In this way, it becomes ideal for the case where the previously described problem occurs in accordance with the formation of the wiring.

Sixthly, in the semiconductor device, it is preferable that the protruding section includes any of an epoxy, a polyimide, a polyamide, an acrylic, Al, P, Fe, Co, Ni, Cu, Zn, Ga, Ge, Ag, Cd, In, Sn, Sb, Au, Pb, and Bi.

A suitable material can be used for the formation of the protruding section, by having the protruding section including any one of an epoxy, a polyimide, a polyamide, an acrylic, Al, P, Fe, Co, Ni, Cu, Zn, Ga, Ge, Ag, Cd, In, Sn, Sb, Au, Pb, or Bi.

Seventhly, in the semiconductor device, it is preferable that a height of the protruding section is 0.1 μm to 3 μm and a height of the convex section is 15 μm to 25 μm.

The resin flows sufficiently along the protruding section by setting the height of the protruding section to 0.1 μm to 3 μm and the height of the convex section to 15 μm to 25 μm.

Eighthly, in the semiconductor device, it is preferable that a part of the protruding section cuts into an inside of the bonding region between the first semiconductor chip and the second semiconductor chip.

A part of the protruding section exists inside the bonding region with the second semiconductor chip, by having the protruding section formed so that this part of the protruding section cuts into the inside of the bonding region between the first semiconductor chip and the second semiconductor chip.

A manufacturing method of a semiconductor device includes forming, on a first semiconductor chip having a plurality of concave and convex sections and bumps for bump bonding a second semiconductor chip formed on a surface side of the first semiconductor chip, a protruding section which straddles at least one convex section out of convex sections of the concave and convex sections formed in a surrounding section of a bonding region between the first semiconductor chip and the second semiconductor chip, bump bonding the first semiconductor chip and the second semiconductor chip together, and sealing a clearance between the first semiconductor chip and the second semiconductor chip by filling, with resin, a space between the bumps formed in accordance with the bump bonding by the bump bonding step, by injecting the resin from a prescribed position on the first semiconductor chip.

Therefore, in the manufacturing method of the semiconductor device, the resin, which has surged up to the convex sections where the protruding section is included, flows into the concave sections between adjacent convex sections along the surface of the protruding section.

A semiconductor device according to an embodiment of the present disclosure includes a first semiconductor chip and a second semiconductor chip which are bump bonded to each other with a clearance therebetween sealed with resin injected from a prescribed position on the first semiconductor chip in a manner that a space between bumps formed by bump bonding is filled with the resin, and a plurality of concave and convex sections which are formed on a surface side of the first semiconductor chip, the surface being bonded with the second semiconductor chip, and have a protruding section which straddles at least one convex section out of convex sections of the plurality of concave and convex sections formed in a surrounding section of a bonding region between the first semiconductor chip and the second semiconductor chip.

Therefore, a fillet with a prescribed width can be suitably formed while preventing a reduction in the degree of freedom in design.

According to another embodiment of the present disclosure, a longitudinal direction of the plurality of concave and convex sections may be a direction parallel to an advancing direction on the first semiconductor chip of the resin injected from the prescribed position, and the protruding section, when viewed from the injection position of the resin, may be formed on a region of both side surface sides of the bonding region with the second semiconductor chip on the first semiconductor chip.

Therefore, the situation in which the spreading of the resin is restricted can be effectively avoided, and an occurrence of the situation in which the width of the fillet is restricted can be avoided.

According to another embodiment of the present disclosure, a longitudinal direction of the plurality of concave and convex sections may be a direction intersecting an advancing direction on the first semiconductor chip of the resin injected from the prescribed position, and the protruding section, when viewed from the injection position of the resin, may be formed on a region of a back side of the bonding region with the second semiconductor chip on the first semiconductor chip.

Therefore, the resin can be poured into a region which is the back side of the bonding region with the second semiconductor chip via the protruding section, and it becomes possible to form the fillet with a prescribed width.

According to another embodiment of the present disclosure, a longitudinal direction of the plurality of concave and convex sections may be a direction intersecting an advancing direction on the first semiconductor chip of the resin injected from the prescribed position, and the protruding section, when viewed from the injection position of the resin, may be formed on a region of a front side of the bonding region with the second semiconductor chip on the first semiconductor chip.

Therefore, it becomes possible to guide the resin within the bonding region via the protruding section, and filling of the resin within the bonding region can be performed.

According to another embodiment of the present disclosure, the plurality of concave and convex sections may be provided in accordance with a formation of wiring.

Therefore, it becomes ideal for the case where the previously described problem occurs in accordance with the formation of the wiring.

According to another embodiment of the present disclosure, the protruding section may include any of an epoxy, a polyimide, a polyamide, an acrylic, Al, P, Fe, Co, Ni, Cu, Zn, Ga, Ge, Ag, Cd, In, Sn, Sb, Au, Pb, and Bi.

Therefore, the protruding section can be suitably formed in the formation process of the bumps.

According to another embodiment of the present disclosure, a height of the protruding section may be 0.1 μm to 3 μm and a height of the convex section may be 15 μm to 25 μm.

Therefore, the resin flows sufficiently along the protruding section, and a fillet with a prescribed width can be suitably formed.

According to another embodiment of the present disclosure, a part of the protruding section may cut into an inside of the bonding region between the first semiconductor chip and the second semiconductor chip.

Therefore, the resin, which has advanced into the spaces between the bumps within the bonding region with the second semiconductor chip, can be surely guided to the outside of the bonding region.

A manufacturing method of a semiconductor device according to another embodiment of the present disclosure includes forming, on a first semiconductor chip having a plurality of concave and convex sections and bumps for bump bonding a second semiconductor chip formed on a surface side of the first semiconductor chip, a protruding section which straddles at least one convex section out of convex sections of the concave and convex sections formed in a surrounding section of a bonding region between the first semiconductor chip and the second semiconductor chip, bump bonding the first semiconductor chip and the second semiconductor chip together, and sealing a clearance between the first semiconductor chip and the second semiconductor chip by filling, with resin, a space between the bumps formed in accordance with the bump bonding by the bump bonding step, by injecting the resin from a prescribed position on the first semiconductor chip.

Therefore, a fillet with a prescribed width can be suitably formed while preventing a reduction in the degree of freedom in design.

BRIEF DESCRIPTION OF THE DRAWINGS

FIGS. 10A and 10B are figures which schematically show a structure of a semiconductor device with a flip-chip structure;

FIG. 11 is a figure which shows a state in which resin is filled as an under-fill material;

FIG. 12 is a figure which shows a state of a semiconductor device after the injection of resin;

FIG. 13 is an upper view of a semiconductor device in which a plurality of lines of wiring is formed on the surface side of the lower chip;

FIGS. 14A and 14B are explanatory diagrams for illustrating that forming a fillet with a prescribed width will become difficult, in the case where concave and convex sections are formed on the surface of the lower chip in accordance with the wiring; and FIGS. 15A and 15B are explanatory diagrams for a semiconductor device of the related art in which slits are formed.

DETAILED DESCRIPTION OF THE EMBODIMENT(S)

Figure 1:
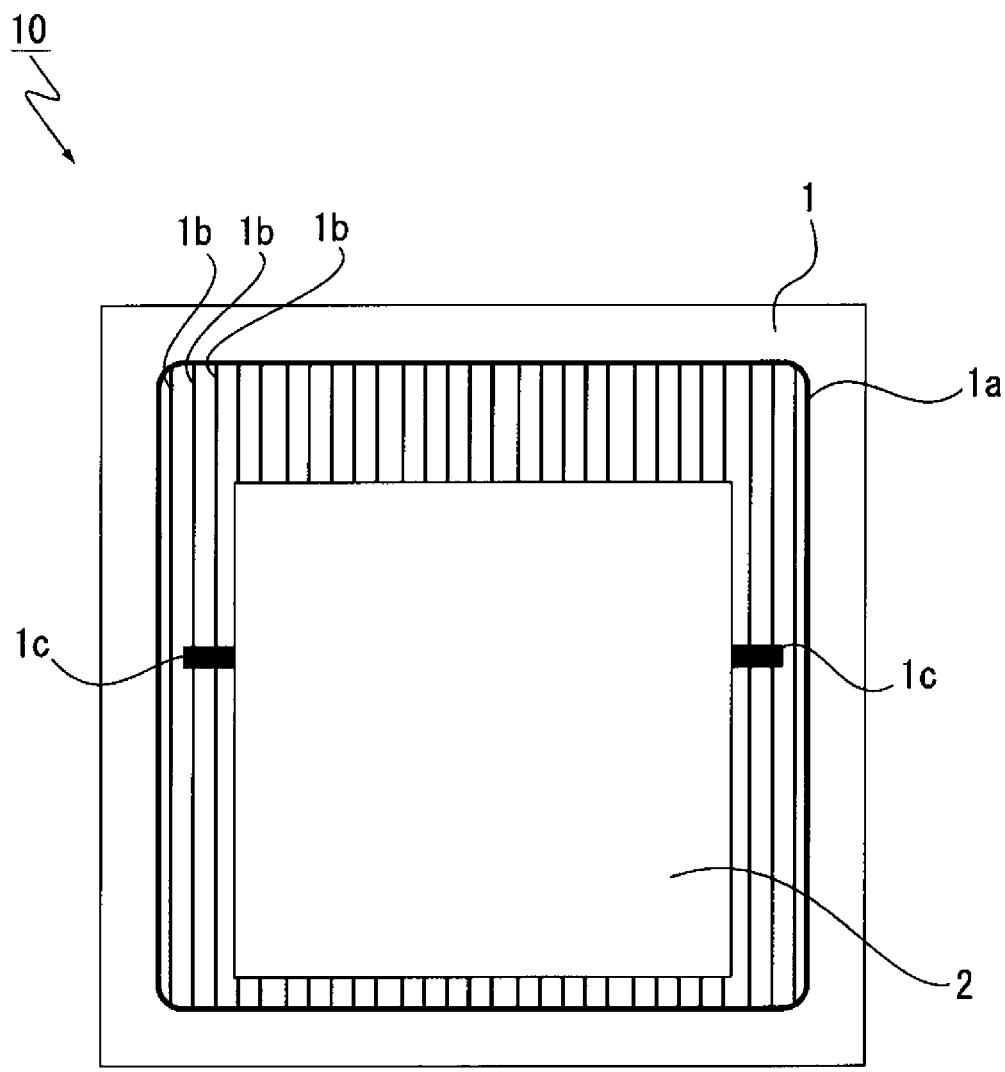
FIG. 1 is an upper view of a semiconductor device of the embodiments according to the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, the embodiments according to the present disclosure will be described.

1. Structure of the Semiconductor Device

FIG. 1 is an upper view of a semiconductor device of the embodiments according to the present disclosure.

A semiconductor device 10 of the present embodiment has a so-called flip-chip structure (a chip-on-chip structure) in which a lower chip 1, as a semiconductor chip arranged downward, and an upper chip 2, as a semiconductor chip arranged upward, are bump bonded together.

In the case of the present example, for example, the lower chip 1 is set as a logic circuit chip, and the upper chip 2 is set as a memory chip (for example, a DRAM).

As described later, while in the semiconductor device 10 the clearance between the lower chip 1 and the upper chip 2 is sealed, by having liquid resin (resin 104) filled as a UF material (under-fill material) in the bump bonded portion between the lower chip 1 and the upper chip 2, from the condition illustrated by FIG. 1, a fillet 105 formed in accordance with the sealing by the resin 104 is omitted from the figure.

The surface of the side on the lower chip 1 where bonding with the upper chip 102 is performed is set as the surface. A dam 1a is formed on the surface of the lower chip 1 for the outer peripheral section. The dam 1a is included in order to prevent the resin 104, which is injected on the lower chip 1 when performing the above-described sealing, from leaking out to the outside of the lower chip 1, and in the case of the present example, is formed approximately rectangular by covering each side of the lower chip 1 as shown in the figure.

The dam 1a is not formed on the outer most section of the lower chip 1, and a margin portion is formed on the side outside of the dam 1a on the surface of the lower chip 1. The margin portion on the side outside of the dam 1a becomes a so-called pad section.

A plurality of lines of wiring 1b is formed on the surface of the lower chip 1. In accordance with the formation of the wiring 1b, concave/convex sections corresponding to the un-formed portions/formed portions of the wiring 1b are provided on the surface of the lower chip 1.

The wiring 1b is formed in at least a region more inside than the dam 1a.

Note that the width of the wiring 1b is, for example, in the range of approximately 3 µm to 35 µm.

In the semiconductor device 10, a protruding section 1c is formed for prescribed lines of the wiring 1b from among the lines of wiring 1b formed on the surface side of the lower chip 1. The protruding section 1c is formed so as to straddle the targeted lines of wiring 1b, and within the figure, the protruding sections 1c formed so as to each straddle two lines of wiring 1b are illustrated as the protruding section 1c.

The formed position of the protruding section 1c is determined in accordance with the relation between the advancing direction of the resin 104 and the wiring direction of the wiring 1b (the longitudinal direction of the wiring 1b). Here, the wiring direction of the wiring 1b can be said to be the longitudinal direction of the concave and convex sections provided on the surface of the lower chip 1 in accordance with the formation of the wiring 1b.

Next, the relation between the advancing direction of the resin 104 and the wiring direction will be described with reference to FIGS. 2A and 2B.

As can be understood from FIGS. 11, 12 and the like described previously, an injection position of the resin 104 on the lower chip 1 is set as a start point, and an advancing direction of the resin 104 becomes a direction from the injection position to a position at which the upper chip 2 is bonded. Therefore, if the injection position of the resin 104 is determined, the relation between the advancing direction of the resin 104 and the wiring position is determined.

When performing injection of the resin 104, it is desirable to prevent the resin 104 from leaking out to the outside of the lower chip 1, or to prevent the resin 104 from riding up onto the upper section of the upper chip 2. Therefore, it is desirable for the injection position of the resin 104 to be a region more inside than the dam 1*a* on the surface of the lower chip 1, and to be set within a region which is outside of the bonding region with the upper chip 2. Further, even if there are regions which satisfy these conditions, since being too near to the bonding region with the upper chip 2 will cause the above described riding up onto the upper section, it may be necessary to be at a position separated to a certain extent from the bonding region with the upper chip 2.

Figure 2:
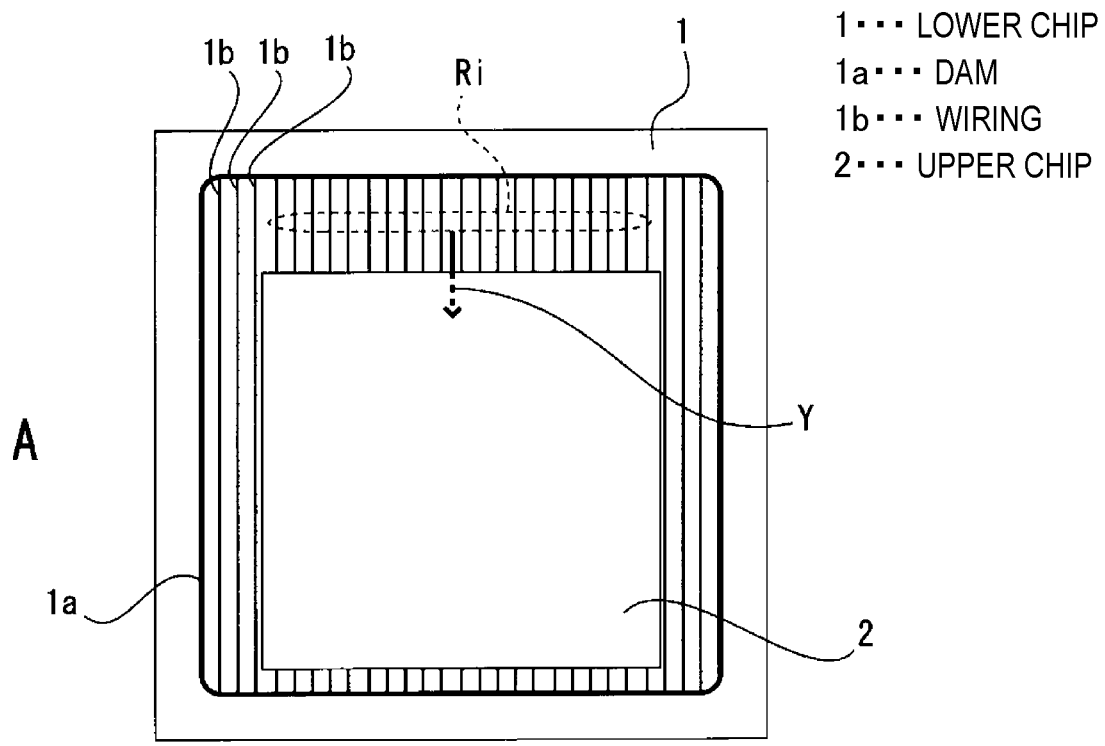
FIGS. 2A and 2B are explanatory diagrams for the relation between the advancing direction of the resin and the wiring direction.
Figure 2:
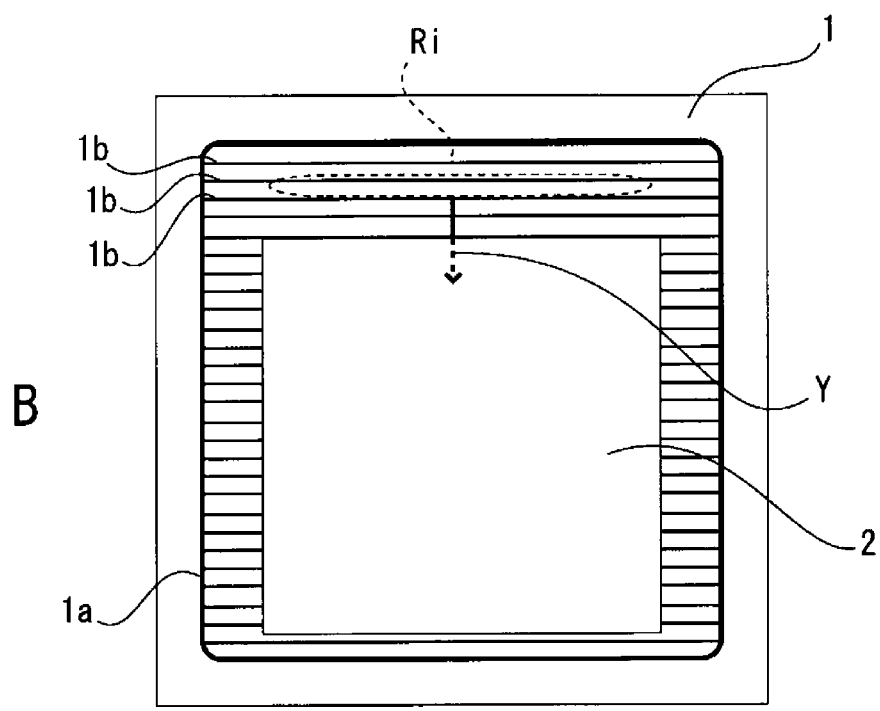

When considering these points, in the semiconductor device 10 shown in each of FIGS. 2A and 2B, for example, a region Ri within each of the figures is limited as the injection position of the resin 104.

In the case of the semiconductor device shown in FIG. 2A, the advancing direction of the resin 104 is the direction shown by the arrow Y within the figure. Therefore, in the case of this semiconductor device, the wiring direction will be parallel to the advancing direction of the resin 104.

On the other hand, in the case of the semiconductor device shown in FIG. 2B, the advancing direction of the resin 104 is the direction shown by the arrow Y within the figure. Therefore, in the semiconductor device of this case, the wiring direction such as in the figure will be a direction orthogonal to the advancing direction of the resin 104.

For example, as in this case, the relation between the wiring direction of the wiring 1*b* and the advancing direction of the resin 104 is determined to be either parallel or orthogonal, by having the injection position of the resin 104 determined at a prescribed position.

As can be understood by comparing with FIG. 2A, in the semiconductor device 10 shown in FIG. 1, the wiring direction of the wiring 1*b* and the advancing direction of the resin 104 will have a relation which is parallel.

As shown in FIG. 1, the protruding section 1*c* in this case is included for both side surface sides of the bonding region with the upper chip 2, when viewed from the injection point of the resin 104 (refer to FIG. 2A).

As described previously by FIGS. 14A and 14B, in the case where the wiring direction is parallel to the advancing direction of the resin 104, the spreading of the resin 104 to both side surface sides of the bonding region with the upper chip 2, when viewed from the injection point of the resin 104, is restricted.

Therefore, the situation in which the spreading of the resin 104 is restricted can be effectively avoided, by including such protruding sections 1*c* on both side surface sides of the bonding region with the upper chip 2. Specifically, the resin 104 which has reached up to the end section of the bonding region, by penetrating within the bonding region (the spaces between the bumps) with the upper chip 2 by a capillary phenomenon, can flow out to the outside along the surface of the protruding sections 1*c*, and the spreading of the resin 104 can be extended to the direction orthogonal to the wiring direction. That is, the occurrence of the situation in which the width of the fillet 105 is restricted can be avoided.

Specifically in the example of FIG. 1, the protruding sections 1*c* are included for the lines of wiring 1*b* adjacent to the edge of the bonding region, from among the lines of wiring 1*b* formed in the regions which are both side surface sides of the bonding region with the upper chip 2.

According to this, the resin 104 can flow out to a side more outside than the edge of the bonding region, in response to the case where advancement of the resin 104 is stopped by this edge of the bonding region.

The spreading width of the resin 104 can be adjusted (by units of the placement intervals of the wiring 1*b*), by an adjustment of the length of such protruding sections 1*c*, similar to that of the slits 106 of the related art. As can be understood from this, it becomes possible to have a formation of the fillet 105 with a prescribed width, by including the protruding sections 1*c*.

The protruding sections 1*c* may be formed so as to straddle the wiring 1*b* which has already been formed, and this formation is very simple. As can also be understood from this point, according to the present embodiment which includes the protruding sections 1*c*, there is no occurrence of design restrictions, such as in the case of forming the slits of the related art, and a reduction of the degree of freedom in design can be prevented.

According to the present embodiment as described above, it becomes possible to suitably form a fillet 105 with a prescribed width while preventing a reduction in the degree of freedom in design, for the semiconductor device 10 with a flip-chip structure in which a plurality of concave and convex sections are provided on the surface of the lower chip 1 in accordance with the formation of wiring 1*b*.

In the case where there are concave and convex sections on the surface of the lower chip 1 in accordance with the formation of the wiring 1*b*, the spreading of the resin 104 will have restrictions, when compared to the case where there are no concave and convex sections. That is, the injected resin 104 becomes a state in which distribution is difficult.

According to this, it becomes easier for an occurrence of the resin 104 after injection riding up onto the upper chip 2. When there is an occurrence of the resin 104 riding up onto the upper chip 2, for example, there is the possibility that a problem such as adversely affecting the quality will occur, in the case where separate chips are additionally laminated on the upper chip 2, by having the smoothness of the laminated separate chips ruined.

However, according to the present embodiment which includes the protruding sections 1*c*, since the injected resin 104 becomes easier to distribute, a solution can be attempted for such a problem of riding up onto the upper chip.

To continue, the case where the wiring direction of the wiring 1*b* is orthogonal to the advancing direction of the resin 104 will be described. Note that here, while the case where the wiring direction is orthogonal to the advancing direction of the resin 104 (the case where they intersect at 90°) is described, the occurring problem and the solution strategy described hereinafter will also be similar for the case where they do not intersect (in particular, the case where they can be considered to be in the vicinity of orthogonal at 90°).

First, the occurring problem in the case where the wiring direction is orthogonal to the advancing direction of the resin 104 will be described with reference to FIGS. 3A and 3B.

Figure 3:
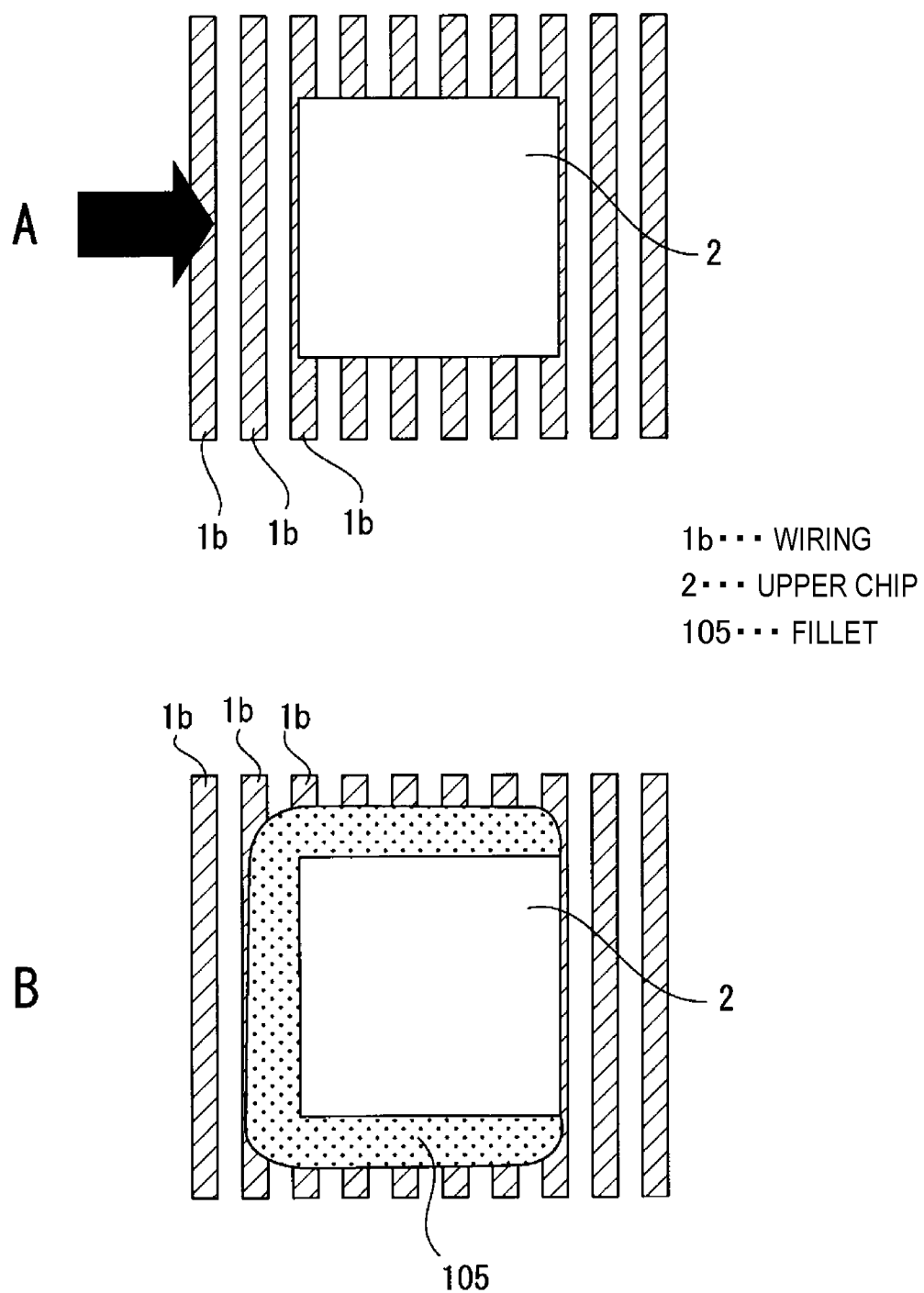
FIGS. 3A and 3B are explanatory diagrams for the problem which occurs in the case where the wiring direction is orthogonal to the advancing direction of the resin.

In FIGS. 3A and 3B, FIGS. 3A and 3B are shown by extracting only the wiring 1*b* and the upper chip 2 formed on the semiconductor device. FIG. 3A shows a state prior to the injection of the resin 104, and FIG. 3B shows a state after the injection of the resin 104.

As can be understood by referring to FIGS. 3A and 3B, in the case where the wiring direction and the advancing direction of the resin 104 are orthogonal to each other, a problem can occur in which the fillet 105 is not able to be formed in the region of a side more inside than the bonding region of the upper chip 2, when viewed from the injection position of the resin 104. Specifically, in the region of the back side of this bonding region, the advancement of the resin 104, which has penetrated within the bonding region by a capillary phenomenon, is stopped by the wiring 1b (convex sections) extending in a direction orthogonal to this advancing direction, and advancement hereinafter may not be possible.

Figure 4:
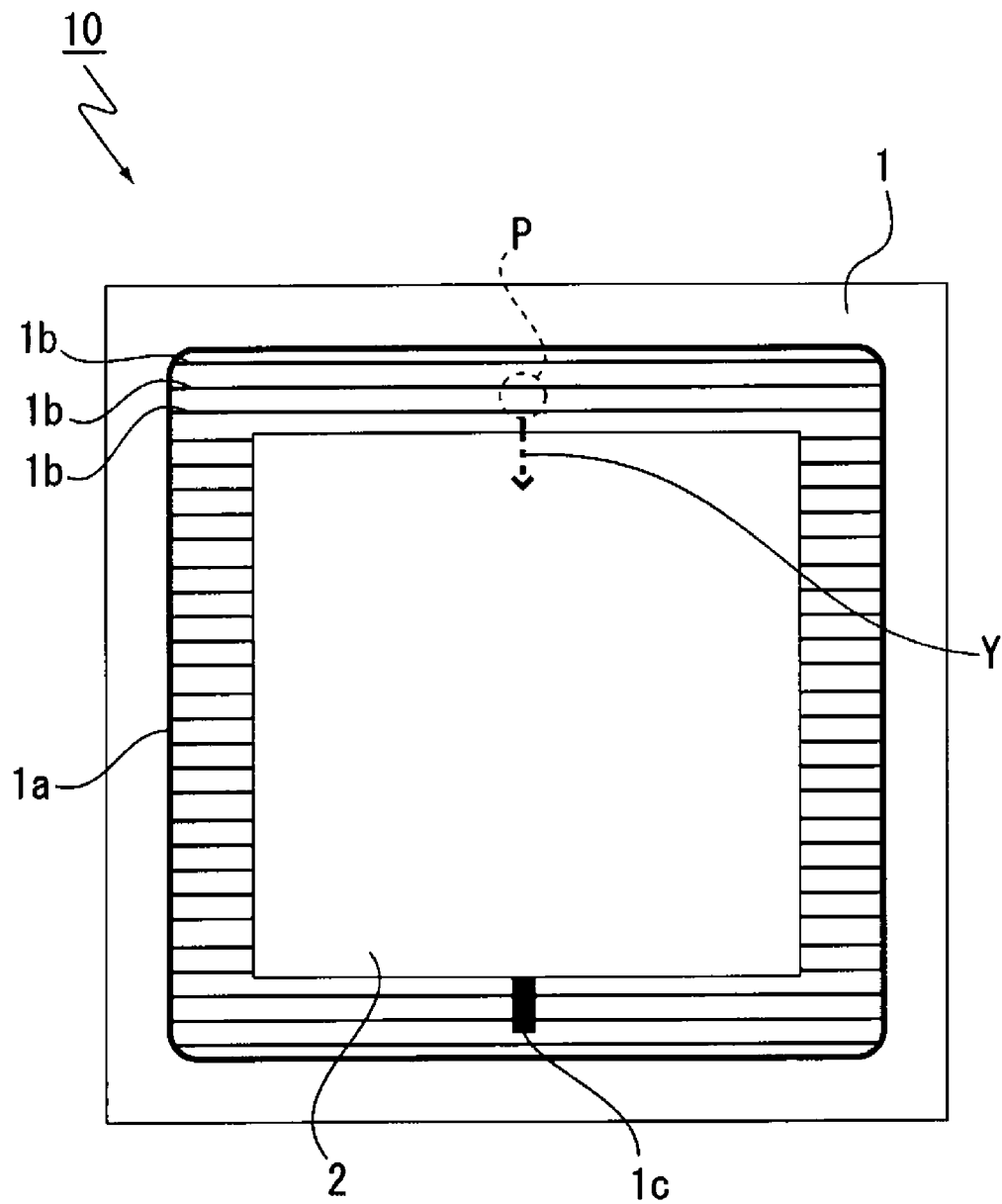
FIG. 4 is an explanatory diagram for the position at which the protruding section is to be included in the case where the wiring direction is orthogonal to the advancing direction of the resin.

Accordingly, in the case where the wiring direction is orthogonal to the advancing direction of the resin 104, a protruding section 1c is included in the region of the back side of the bonding region with the upper chip 2, when viewed from the injection position of the resin 104, such as shown in FIG. 4.

In this way, the resin 104 can be poured into the region of the back side of the bonding region with the upper chip 2, via the protruding section 1c. Therefore, it becomes possible to form the fillet 105 with a prescribed width.

Note that also in the example of FIG. 4, while the protruding section 1c is included for the lines of wiring 1b adjacent to the edge of the bonding region, from among the lines of wiring 1b formed in the region which is the back side of the bonding region with the upper chip 2, according to this, the resin 104 can flow out to a side more outside than the edge of the bonding region, in response to the case where advancement of the resin 104 is stopped by this edge of the bonding region.

Here, in the case where the wiring direction is orthogonal to the advancing direction of the resin 104, not only is there a problem of the formation width of the fillet 105, but there is also the possibility that the filling of the resin 104 itself to the bonding region with the upper chip 2 may not be possible.

Figure 5:
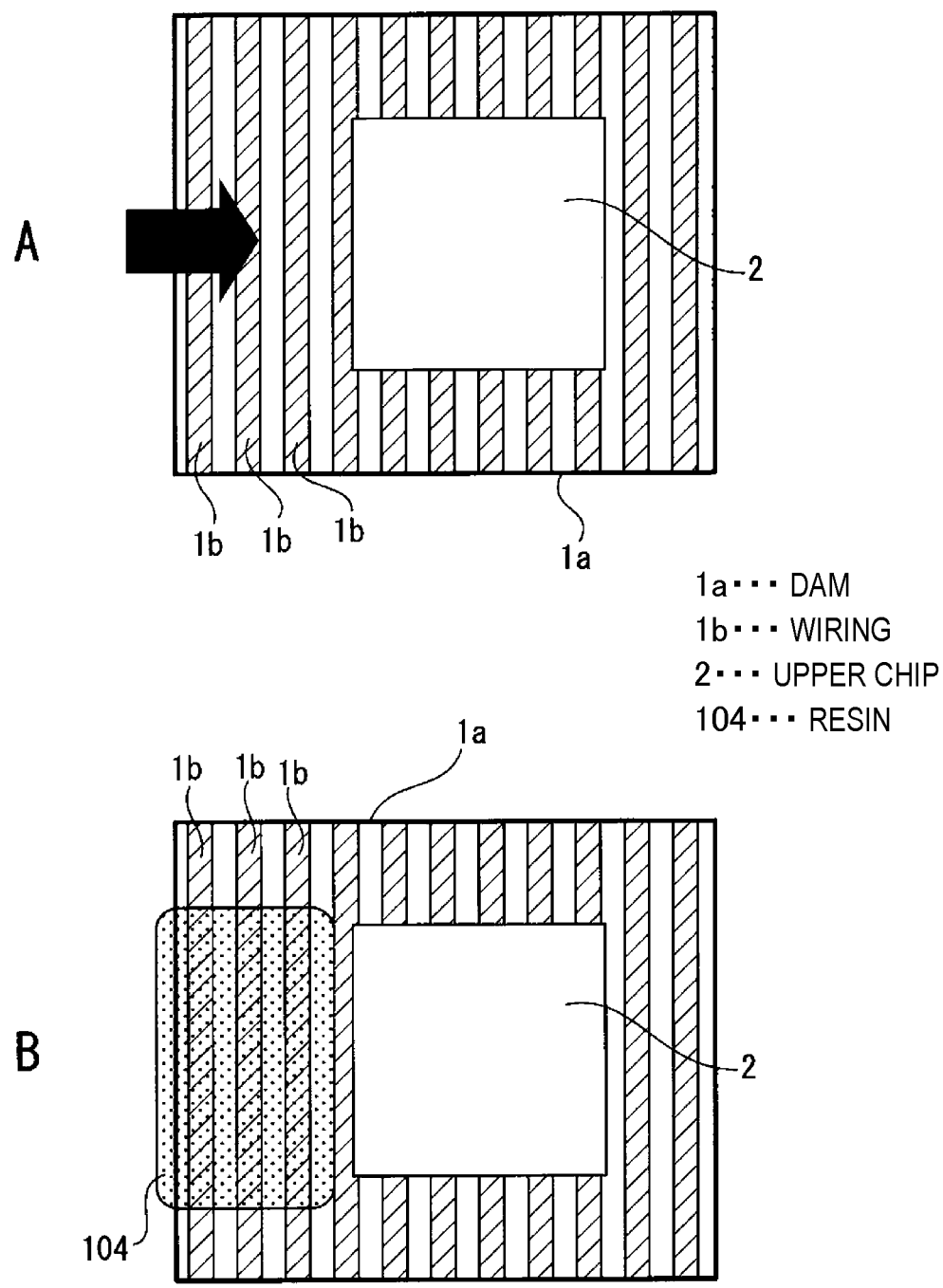
FIGS. 5A and 5B are explanatory diagrams for the possibility in which filling of the resin to the bonding region with the upper chip is not possible in the case where the wiring direction is orthogonal to the advancing direction of the resin.

FIGS. 5A and 5B are figures for describing this point.

Note that in FIGS. 5A and 5B, FIGS. 5A and 5B show extracting only the wiring 1b, the upper chip 2, and the dam 1a formed on the semiconductor device of each embodiment, and FIG. 5A shows a state prior to the injection of the resin 104, and FIG. 5B shows a state after the injection of the resin 104.

As shown in FIG. 5A and FIG. 5B, in the case where the wiring direction is orthogonal to the advancing direction of the resin 104, a situation can occur in which the injected resin 104 leaks out from the dam 1a, and filling of the resin 104 within the bonding region with the upper chip 2 may not be possible.

That is, prior to the injected resin 104 reaching the bonding region with the upper chip 2, advancement is obstructed by the wiring 1b orthogonal to this advancing direction, dispersion of the resin 104 is restricted to the direction in which the bonding region with the upper chip 2 exists, and there is the possibility that the resin 104 will leak to the outside of the dam 1a in reaction.

Figure 6:
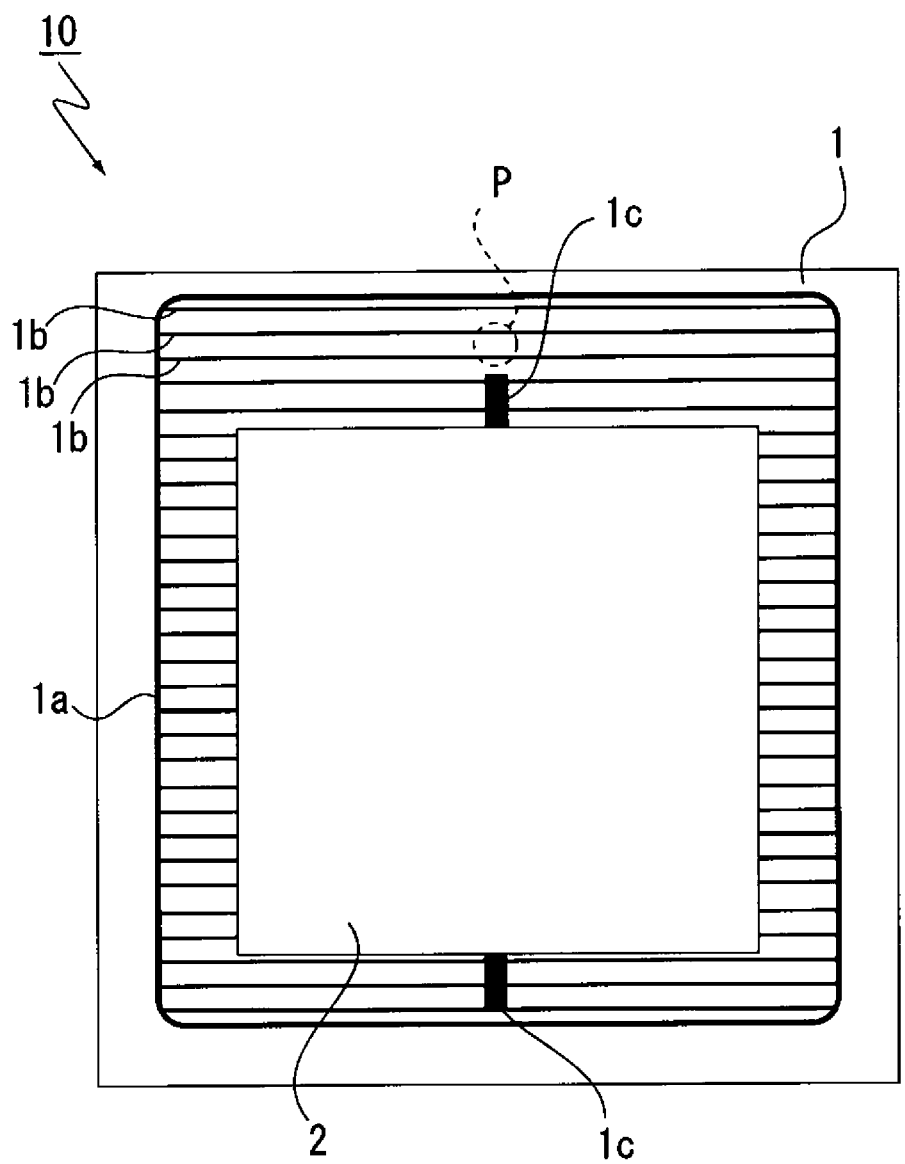
FIG. 6 is an explanatory diagram for the position at which the protruding section is to be included, in response to the case where filling of the resin to the bonding region with the upper chip is not possible.

In order to prevent an occurrence of such a problem, in the case where the wiring direction is orthogonal to the advancing direction of the resin 104, a protruding section 1c is included in the region of a front side of the bonding region with the upper chip 2, when viewed from the injection position of the resin 104, such as shown in FIG. 6.

If such a protruding section 1c is included in the front side of the bonding region with the upper chip 2, it becomes possible to guide the resin 104 injected at a position P to within this bonding region via the protruding section 1c. That is, it becomes possible for the resin 104 to fill within this bonding region, by preventing the resin 104 from leaking out from the dam 1a.

Note that, the formed position of the protruding section 1c may be set to a position at which it is possible for the resin 104 to fill within the bonding region with the upper chip 102, from a result actually performed experimentally or the like.

Here, as can be understood from the above described description, the protruding section 1c may be included for at least a surrounding section of the bonding region with the upper chip 2.

If such a protruding section 1c is included for the surrounding section of the bonding region with the upper chip 2, it becomes possible for the formation of the fillet 105 with a prescribed width, for the case where the wiring direction is either parallel or orthogonal to the advancing direction of the resin 104. Further, by including the protruding section 1c for the surrounding section of the bonding region with the upper chip 2, in the case where the wiring direction and the advancing direction of the resin 104 intersect each other, it becomes possible to prevent an occurrence of the situation in which filling of the resin 104 is not possible.

More specifically, the protruding section 1c may be included at least for the wiring 1b at which the advancement of the resin 104 stops in the case where there is no protruding section 1c. In this way, it can become possible for the formation of the fillet 105 with a prescribed width, in response to the cases where the wiring direction is either parallel or orthogonal to the advancing direction of the resin 104, or it can become possible for filling of the resin 104 to within the spaces within the bumps, in response to the case where filling of the resin 104 is not possible in the spaces between the bumps when the wiring direction and the advancing direction of the resin 104 are orthogonal to each other.

In particular, when forming the fillet 105 with a prescribed width, a protruding section 1c may be included for the wiring 1b at which the advancement of the resin 104, which flows to the outside of the bonding region with the upper chip 2 along the spaces between the bumps, is stopped in the case where there is no protruding section 1c.

2. Manufacturing Method

To continue, a manufacturing method of the semiconductor device 10 of the embodiments such as described above will be described with reference to the flow chart of FIG. 7.

Figure 7:
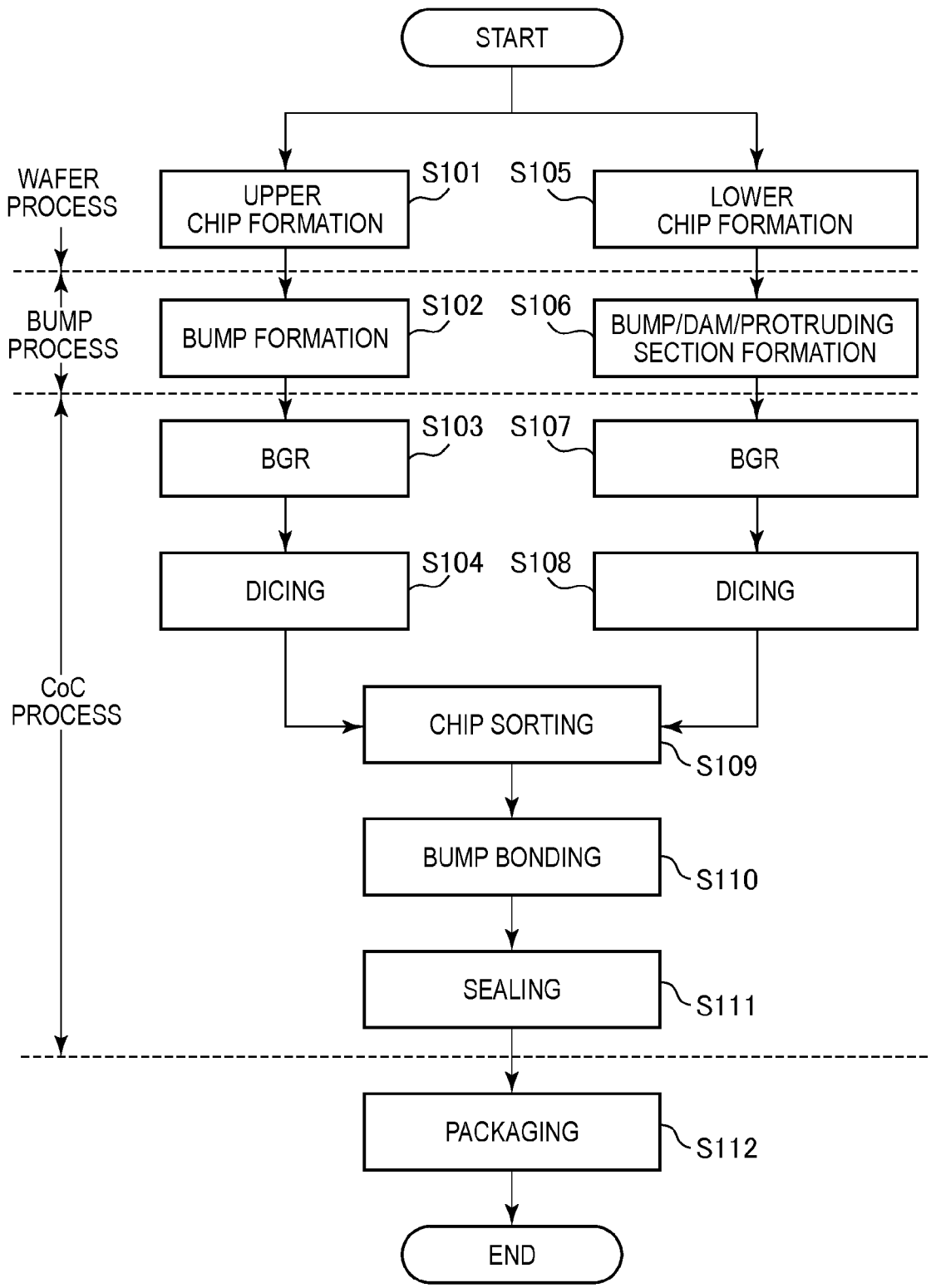
FIG. 7 is a flow chart for describing a manufacturing method of the semiconductor device of the embodiments according to the present disclosure.

In FIG. 7, steps S101 to S104 are processes for generating the upper chip 2, and steps S105 to S108 are processes for generating the lower chip 1.

These processes for obtaining the upper chip 2 and the lower chip 1 can be performed in parallel.

First, in an upper chip formation process of step S101, a plurality of upper chips 2 are formed on a silicon wafer, as a wafer process.

Then, after the plurality of upper chips 2 are formed on the wafer, bumps 3 are formed on each of the upper chips 2, by a bump formation process of step S102. The bumps 3 are formed at prescribed positions determined in advance.

After the formation of the bumps 3 on each of the upper chips 2, the silicon wafer on which the upper chips 2 are formed is ground from the rear surface side, by a BGR (Back Grinding) process of step S103.

Then, after the BGR process is completed, each of the upper chips 2 are cut out from the silicon wafer, by a dicing process of step S104.

On the other hand, as processes on the side of the lower chip 1, first a plurality of lower chips 1 are formed on a silicon wafer, by a lower chip formation process of step S105.

Then, after the plurality of lower chips are formed on the wafer, bumps 3, a dam 1a, and a protruding section 1c are formed on each of the lower chips 1, by a bump/dam/protruding section formation process of step S106.

The bumps 3, dam 1a, and protruding section 1c are each formed at prescribed formed positions determined in advance.

For example, an epoxy, a polyimide, a polyamide, an acrylic, Al, P, Fe, Co, Ni, Cu, Zn, Ga, Ge, Ag, Cd, In, Sn, Sb, Au, Pb, or Bi can be included as the material of the protruding section 1c. By using these materials, it becomes possible to form the protruding section 1c in the formation process (bump process) of the bumps 3 and dam 1a.

After the bumps 3, dam 1a, and protruding section 1c are formed on each of the lower chips 1, the silicon wafer on which the lower chips 1 are formed is ground from the rear surface side, by a BGR process of step S107, and afterwards each of the lower chips 1 are cut out from the silicon wafer, by a dicing process of step S108.

After the dicing processes by steps S104 and step S108 are completed, the cut-out upper chips 2 and lower chips 1 are arranged in a prescribed manner, by a chip sorting process of step S109. Specifically, the cut-out upper chips 2 and lower chips 1 are arranged in a manner suitable for bonding each of the upper chips 2 and lower chips 1 together by a bump bonding process described hereinafter.

After the chip sorting process of step S109 is completed, each of the upper chips 2 are bump bonded onto each of the lower chips 1, by a bump bonding process of step S110. Specifically, the upper chips 2 and lower chips 1 are bonded together by facing the formation surfaces of each set of bumps 3.

After the bump bonding process of step S110 is completed, a sealing process is performed by step S111. That is, for each set of a bump bonded upper chip 2 and lower chip 1, the spaces within a bump bonding region are filled by injecting liquid resin 104 as a UF material from a prescribed position on the surface of the lower chip 1, and thereafter, the clearance between the lower chip 1 and upper chip 2 is sealed by curing the resin 104, for example, by a heat treatment or the like.

After the sealing process of step S111 is completed, packing is performed for each set of a sealed lower chip 1 and upper chip 2, by a packing process of step S112, and this completes the semiconductor device 10 as a product.

Heretofore, the manufacturing process of the semiconductor device 10 of the embodiments ends.

Note that, the processes of steps S102 and S106 become a so-called bump process, such as also shown within the figure. Further, the processes from the BGR process of steps S103 and S107 up to the sealing step of S111 become a so-called CoC (Chip on Chip) process.

Figure 8:
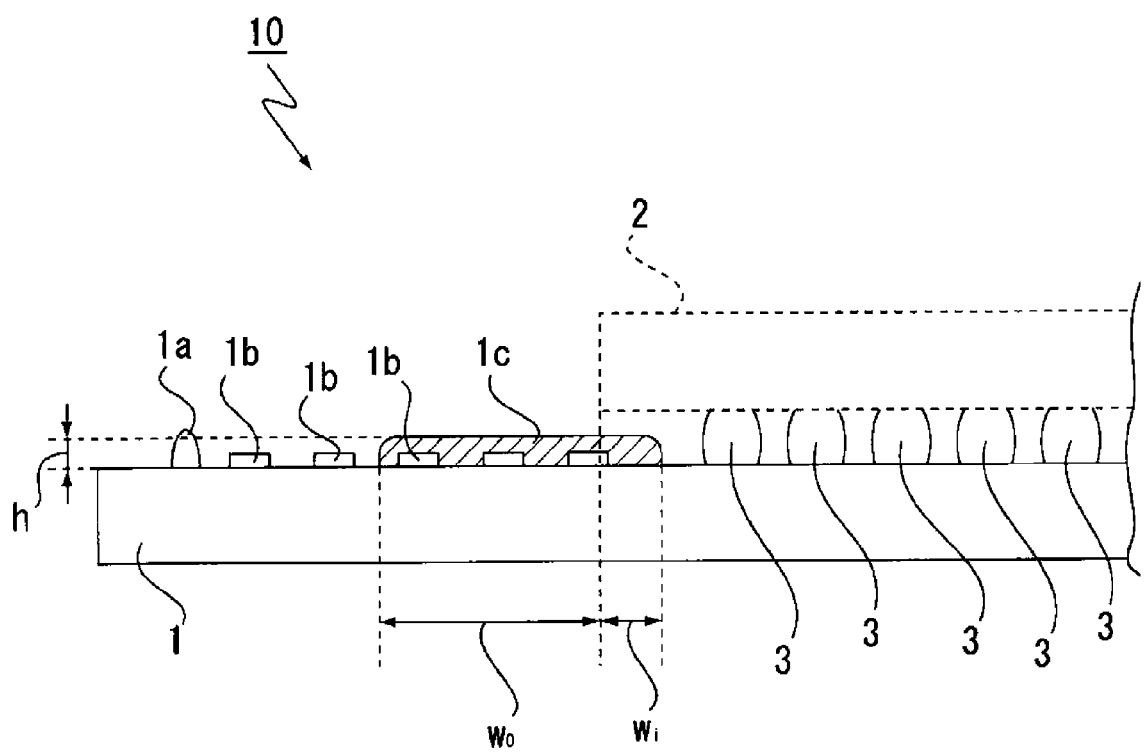
FIG. 8 is a figure which shows a cross-section structure of a semiconductor device manufactured by the manufacturing method of the embodiments.

FIG. 8 shows a cross-section structure of the semiconductor device 10 manufactured by the above described manufacturing method.

In FIG. 8, the cross-section structure of the semiconductor device 10 is shown prior to the sealing process (S111).

As shown in FIG. 8, in the present example, the protruding section 1c is formed so that a part of this protruding section cuts into the inside of the bonding region with the upper chip 2.

Note that the bonding region with the upper chip 2 mentioned here has the meaning of a region in which the upper chip 2 is covering the lower chip 1 after bump bonding.

The resin 104, which has advanced into the spaces between the bumps within the bonding region with the upper chip 2, can be more surely guided to outside of the bonding region, by having such a part of the protruding section 1c cut into the inside of the bonding region with the upper chip 2.

Further, as described previously for FIGS. 5A and 5B, in the case where it becomes difficult for the injected resin 104 to fill the spaces between the bumps when it is the case where the wiring direction and the advancing direction of the resin 104 are orthogonal to each other, the injected resin 104 can be more certainly guided into to the spaces between the bumps.

Hereinafter, a specific example of the dimensions of each section will be included.

A semiconductor device 10 is included as an example, which is of a type where the wiring direction and the advancing direction of the resin 104 intersect each other (in this case, are orthogonal to each other) such as described previously for FIG. 2B. In the present embodiment, only one protruding section 1c is included on the front side of the bonding region with the upper chip 2, when viewed from the injection position of the resin 104, in response to the case where the resin 104 is not able to fill the spaces between the bumps.

In the semiconductor device 10 of the present embodiment, the length of the horizontal direction, that is, the length of the direction parallel to the wiring direction, of the lower chip 1 is set to 9.2458 mm, and the length of the vertical direction is set to 9.5222 mm. Further, the lengths of the horizontal direction and the vertical direction of the upper chip 2 are 8.134 mm and 7.910 mm, respectively. In the horizontal direction, the distance between the right side surrounding of the upper chip 2 and the dam 1a, and the distance between the left side surrounding of the upper chip 2 and the dam 1a, are both the same at 225 µm. Further, in the vertical direction, the distance between the front side surrounding of the upper chip 2 (the surroundings nearest to the injection position of the resin 104) and the dam 1a is set to 725 µm, and the distance between the back side surrounding and the dam 1a is set to 228 µm.

In the present embodiment, a length wi of the portion which the protruding section 1c has cut into the inside of the bonding region with the upper chip 2 is set to approximately 100 µm. The length of the entire protruding section 1c is approximately 600 µm, and a length wo of the portion which the protruding section 1c presents to the outside of the bonding region with the upper chip 2 is approximately 500 µm. In this case, from the assumption that the distance between the front side surrounding of the upper chip 2 and the dam 1a such as described above is 725 µm, the distance from the edge section of the protruding section 1c up to the dam 1a will be approximately 225 µm, by 725 µm-500 µm.

Further, it is desirable that a height h of the protruding section 1c is approximately 15 µm to 25 µm. In a semiconductor device with a flip-chip structure in a present state, this will correspond in general to a height of the wiring 1b formed on the lower chip 1 (height of the convex sections) of approximately 0.1 µm to 3 µm.

Specifically, in the present embodiment, the height h of the protruding section 1c is set to approximately 15 µm Hereinafter, an injection experiment performed for demonstrating the effectiveness of the protruding section 1c will be described.

In this experiment, in the case where the wiring direction and the advancing direction of the resin 104 are orthogonal to each other, and in the case where the protruding section 1c is to be formed on the front side of the upper chip 102, when viewed from the injection position of the resin 104, whether or not the filling of the resin 104 to the spaces between the bumps is performed, and the presence or absence of bleeding out, will be confirmed for the case where there is a protruding section 1c and the case where there is no protruding section 1c, in the case where the injection position of the resin 104 is either a position 150 µm or 325 µm inside of the dam 1a. Bleeding out indicates a phenomenon where the resin 104 flows to the outside of the dam 1a.

In the experiment, a semiconductor device 10 is used where the distance from the front side surrounding of the upper chip 2 up to the dam 1a is 735 µm. Further, in the case where there is a protruding section 1c, a protruding section 1c is used similar to that of the above described embodiment. That is, the length of the entire protruding section 1c is approximately 600 µm, and the length wi of the portion which the protruding section 1c has cut into the inside of the bonding region with the upper chip 2 is approximately 100 µm. In this case, the distance from the edge section of the protruding section 1c up to the dam 1a is approximately 225 µm.

According to the experiment, in the case where there is no protruding section 1c, filling of the resin 104 to the spaces between the bumps is not able to be performed, even if the injection position of the resin 104 is either of the above described positions of 150 µm or 325 µm, and bleeding out will occur as a result. Note that, while the experiment is performed three times for the above described position of 150 µm and two times for the above described position of 325 µm, the results are all obtained similarly.

In contrast to this, in the case where the protruding section 1c is included, filling of the resin 104 to the spaces between the bumps can be performed, even if the injection position of the resin 104 is either of the above described positions of 150 µm or 325 µm. Note that, while the number of experiments is two times for the above described position 150 µm and three times for the above described position 325 µm, the results are all obtained similarly.

3. Modified Example

While heretofore the embodiments according to the present disclosure have been described, the present disclosure is not limited to the above illustrated specific examples.

For example, the dimensions of each section included above merely show examples, and these may be arbitrary determined in accordance with the embodiments.

Figure 9:
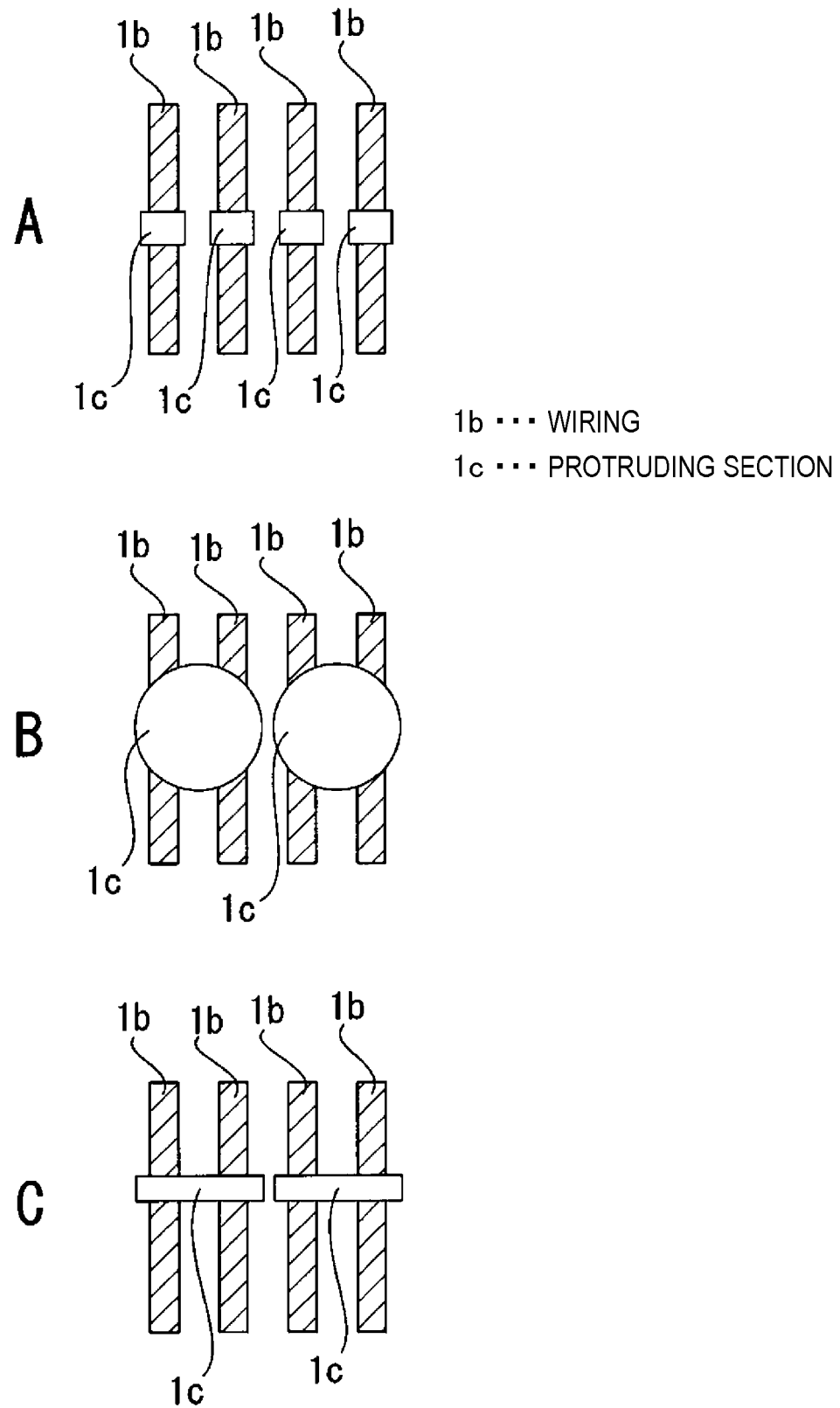
FIGS. 9A-9C are figures which show a modified example of the protruding section.

Further, in the description up until here, while the case has been illustrated where the resin 104 is guided only a necessary distance by one protruding section formed so as to straddle a plurality of lines of wiring 1b (convex sections), instead of this, for example, as shown in FIGS. 9A-9C, it can be configured so that the resin 104 is guided only a necessary distance, by arranging a plurality of protruding sections 1c formed so as to straddle only one line of the wiring 1b.

Further, for example, other than the exterior shape of the protruding section 1c being rectangular, the exterior shape can also be another shape, such as a circular shape as shown in FIG. 9B. In the example of FIG. 9B, the case is shown where circular shaped protruding sections 1c are formed so as to straddle each of the plurality of lines of wiring 1b.

When the resin 104 is guided only a necessary distance, as shown in FIGS. 9B and 9C, it can be configured by arranging a plurality of protruding sections 1c formed so as to straddle the plurality of lines of wiring 1b. In FIG. 9C, an example is shown which arranges a plurality of rectangular protruding sections 1c formed so as to straddle the plurality of lines of wiring 1b.

Further, in the description up until here, while a case has been illustrated where the protruding section 1c is formed in the stage when a plurality of lower chips 1 are formed on a wafer, it is also possible for the formation process of the protruding section 1c to be performed for each of the lower chips 1 cut out by the dicing process.

<The Present Disclosure>

Additionally, the present disclosure may also be configured as below.

(1)
A semiconductor device including:
a first semiconductor chip and a second semiconductor chip which are bump bonded to each other with a clearance therebetween sealed with resin injected from a prescribed position on the first semiconductor chip in a manner that a space between bumps formed by bump bonding is filled with the resin; and
a plurality of concave and convex sections which are formed on a surface side of the first semiconductor chip, the surface being bonded with the second semiconductor chip, and have a protruding section which straddles at least one convex section out of convex sections of the plurality of concave and convex sections formed in a surrounding section of a bonding region between the first semiconductor chip and the second semiconductor chip.

(2)
The semiconductor device according to (1),
wherein a longitudinal direction of the plurality of concave and convex sections is a direction parallel to an advancing direction on the first semiconductor chip of the resin injected from the prescribed position, and
wherein the protruding section, when viewed from the injection position of the resin, is formed on a region of both side surface sides of the bonding region with the second semiconductor chip on the first semiconductor chip.

(3)
The semiconductor device according to (1),
wherein a longitudinal direction of the plurality of concave and convex sections is a direction intersecting an advancing direction on the first semiconductor chip of the resin injected from the prescribed position, and
wherein the protruding section, when viewed from the injection position of the resin, is formed on a region of a back side of the bonding region with the second semiconductor chip on the first semiconductor chip.

(4)
The semiconductor device according to any one of (1) to (3),
wherein a longitudinal direction of the plurality of concave and convex sections is a direction intersecting an advancing direction on the first semiconductor chip of the resin injected from the prescribed position, and
wherein the protruding section, when viewed from the injection position of the resin, is formed on a region of a front side of the bonding region with the second semiconductor chip on the first semiconductor chip.

(5)
The semiconductor device according to any one of (1) to (4),
wherein the plurality of concave and convex sections is provided in accordance with a formation of wiring.

(6)
The semiconductor device according to any one of (1) to (5),
wherein the protruding section includes any of an epoxy, a polyimide, a polyamide, an acrylic, Al, P, Fe, Co, Ni, Cu, Zn, Ga, Ge, Ag, Cd, In, Sn, Sb, Au, Pb, and Bi.

(7)
The semiconductor device according to any one of (1) to (6),
wherein a height of the protruding section is 0.1 µm to 3 µm and a height of the convex section is 15 µm to 25 µm.

(8)
The semiconductor device according to any one of (1) to (7),
wherein a part of the protruding section cuts into an inside of the bonding region between the first semiconductor chip and the second semiconductor chip.

(9)
A manufacturing method of a semiconductor device, including:

forming, on a first semiconductor chip having a plurality of concave and convex sections and bumps for bump bonding a second semiconductor chip formed on a surface side of the first semiconductor chip, a protruding section which straddles at least one convex section out of convex sections of the concave and convex sections formed in a surrounding section of a bonding region with the second semiconductor chip;

bump bonding the first semiconductor chip and the second semiconductor chip together; and sealing a clearance between the first semiconductor chip and the second semiconductor chip by filling, with resin, a space between the bumps formed in accordance with the bump bonding by the bump bonding step, by injecting the resin from a prescribed position on the first semiconductor chip.

The present disclosure contains subject matter related to that disclosed in Japanese Priority Patent Application JP 2012-208303 filed in the Japan Patent Office on Sep. 21, 2012, the entire content of which is hereby incorporated by reference.

What is claimed is:

1. A semiconductor device comprising:
a first semiconductor chip and a second semiconductor chip which are bump bonded to each other with a clearance therebetween sealed with resin injected from a prescribed position on the first semiconductor chip in a manner that a space between bumps formed by bump bonding is filled with the resin; and
a plurality of concave and convex sections which are formed on a surface side of the first semiconductor chip, the surface side being bonded with the second semiconductor chip, and have a protruding section which straddles at least one convex section out of convex sections of the plurality of concave and convex sections formed in a surrounding section of a bonding region between the first semiconductor chip and the second semiconductor chip,
wherein,
a longitudinal direction of the plurality of concave and convex sections is a direction parallel to an advancing direction on the first semiconductor chip of the resin injected from the prescribed position, and
the protruding section, when viewed from the injection position of the resin, is formed on a region of both side surface sides of the bonding region with the second semiconductor chip on the first semiconductor chip.

2. The semiconductor device according to claim 1, wherein the plurality of concave and convex sections is provided in accordance with a formation of wiring.

3. The semiconductor device according to claim 1, wherein the protruding section includes any of an epoxy, a polyimide, a polyamide, an acrylic, Al, P, Fe, Co, Ni, Cu, Zn, Ga, Ge, Ag, Cd, In, Sn, Sb, Au, Pb, and Bi.

4. The semiconductor device according to claim 1, wherein a height of the protruding section is 0.1 .mu.m to 3 .mu.m and a height of the convex section is 15 .mu.m to 25 .mu.m.

5. The semiconductor device according to claim 1, wherein a part of the protruding section cuts into an inside of the bonding region between the first semiconductor chip and the second semiconductor chip.

6. A semiconductor device comprising:
a first semiconductor chip and a second semiconductor chip which are bump bonded to each other with a clearance therebetween sealed with resin injected from a prescribed position on the first semiconductor chip in a manner that a space between bumps formed by bump bonding is filled with the resin; and
a plurality of concave and convex sections which are formed on a surface side of the first semiconductor chip, the surface side being bonded with the second semiconductor chip, and have a protruding section which straddles at least one convex section out of convex sections of the plurality of concave and convex sections formed in a surrounding section of a bonding region between the first semiconductor chip and the second semiconductor chip,
wherein,
a longitudinal direction of the plurality of concave and convex sections is a direction intersecting an advancing direction on the first semiconductor chip of the resin injected from the prescribed position, and
the protruding section, when viewed from the injection position of the resin, is formed on a region of a back side of the bonding region with the second semiconductor chip on the first semiconductor chip.

7. The semiconductor device according to claim 6, wherein the protruding section, when viewed from the injection position of the resin, is formed on a region of a front side of the bonding region with the second semiconductor chip on the first semiconductor chip.

8. The semiconductor device according to claim 6, wherein the plurality of concave and convex sections is provided in accordance with a formation of wiring.

9. The semiconductor device according to claim 6, wherein the protruding section includes any of an epoxy, a polyimide, a polyamide, an acrylic, Al, P, Fe, Co, Ni, Cu, Zn, Ga, Ge, Ag, Cd, In, Sn, Sb, Au, Pb, and Bi.

10. The semiconductor device according to claim 6, wherein a height of the protruding section is 0.1 .mu.m to 3 .mu.m and a height of the convex section is 15 .mu.m to 25 .mu.m.

11. The semiconductor device according to claim 6, wherein a part of the protruding section cuts into an inside of the bonding region between the first semiconductor chip and the second semiconductor chip.

12. A manufacturing method of a semiconductor device, comprising:
forming, on a first semiconductor chip having a plurality of concave and convex sections and bumps for bump bonding a second semiconductor chip formed on a surface side of the first semiconductor chip, a protruding section which straddles at least one convex section out of convex sections of the plurality of concave and convex sections formed in a surrounding section of a bonding region between the first semiconductor chip and the second semiconductor chip;

bump bonding the first semiconductor chip and the second semiconductor chip together; and sealing a clearance between the first semiconductor chip and the second semiconductor chip by filling, with resin, a space between the bumps formed in accordance with the bump bonding by the bump bonding step, by injecting the resin from a prescribed position on the first semiconductor chip
wherein,
a longitudinal direction of the plurality of concave and convex sections is a direction parallel to an advancing direction on the first semiconductor chip of the resin injected from the prescribed position, and
the protruding section, when viewed from the injection position of the resin, is formed on a region of both side surface sides of the bonding region with the second semiconductor chip on the first semiconductor chip.

* * * * *